(12) United States Patent
Cook et al.

(10) Patent No.: US 7,966,530 B2
(45) Date of Patent: Jun. 21, 2011

(54) METHODS, DEVICES, AND SYSTEMS FOR EXPERIENCING REDUCED UNEQUAL TESTING DEGRADATION

(75) Inventors: Bryce Cook, Nampa, ID (US); Nick Labrum, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 733 days.

(21) Appl. No.: 12/002,830

(22) Filed: Dec. 18, 2007

(65) Prior Publication Data

US 2009/0158102 A1    Jun. 18, 2009

(51) Int. Cl.
*G11C 29/00* (2006.01)
*G11C 7/00* (2006.01)

(52) U.S. Cl. ........................................ 714/718; 365/200

(58) Field of Classification Search .................. 714/718, 714/734, 731, 742, 744, 764, 798; 365/200, 365/201
See application file for complete search history.

(56) References Cited

U.S. PATENT DOCUMENTS

| | | | |
|---|---|---|---|
| 5,734,661 A * | 3/1998 | Roberts et al. ................ | 714/733 |
| 7,333,098 B2 * | 2/2008 | Kobayashi .................... | 345/204 |
| 2008/0291761 A1 * | 11/2008 | Lee et al. ...................... | 365/201 |

* cited by examiner

Primary Examiner — Christine T Tu
(74) Attorney, Agent, or Firm — Dorsey & Whitney LLP

(57) ABSTRACT

One or more embodiments of the present invention reduce uneven degradation during testing by providing for a toggling signal to be applied to remaining input paths which do not receive test signals. Therefore, rather than being held in a fixed state during the burn-in process, the remaining inputs are toggled as well. Consequently, they degrade at a more similar rate as their counterpart inputs that did receive test signals.

25 Claims, 4 Drawing Sheets

METHODS, DEVICES, AND SYSTEMS FOR EXPERIENCING REDUCED UNEQUAL TESTING DEGRADATION

TECHNICAL FIELD

This invention relates to reducing unequal testing degradation in electronic or electromechanical devices.

BACKGROUND

High technology components often suffer from an "infant mortality" problem. The components have a higher failure rate soon after being placed in service, followed by a decreased failure rate for the duration of the components' useful life. That is, if a device is going to fail, it is more likely to do so early in its useful life. These early failures can have a variety of causes, including bulk material defects and manufacturing variances. Burn-in testing is often performed to identify the components that will fail early on. The devices that survive the burn-in testing without failure can be expected to survive their useful life.

Burn-in testing generally involves utilizing the device for its intended purpose, or sometimes applying harsher than anticipated conditions for a period of time. The devices may be subject to increased heat, voltage or current, or may simply be operated according to their normal operating parameters.

Burn-in testing can be time-consuming and expensive. For example, to test an array of memory cells, data must be written to and read from the cells in the array using data test signals and a test clock signal. During testing, a test unit can apply and receive data signals to all of the data terminals of one or more memory device. However, the test unit can simultaneously test a larger number of memory devices if it applies data signals to and receives data signals from only some of the data terminals. Accordingly, compression testing is typically performed during burn-in of memory devices. In compression testing, burn-in test signals are applied only to a portion of the eternally-accessible data terminals. The memory device uses internal test mode circuitry to internally map the externally provided test signals to multiple memory cells within the device. The device then can internally map the external signals to cells in the memory array in addition to the memory cells that normally receive the data signals for a given address. The remaining externally-accessible data terminals "upstream" from where the data signals are mapped are decoupled from the memory cells and are held in the same state, usually a supply voltage $V_{CC}$ or ground, throughout the burn-in testing process. Similarly, read signals are applied to only a portion of the externally-accessible data terminals and then internally mapped to multiple memory cells within the device. Internal test mode circuitry then compares the read data, and sets an internal flag if an error is encountered. Each device is then interrogated for the presence of a flag. This allows more memory devices to go through burn-in testing in less time.

DETAILED DESCRIPTION

Compression testing can undesirably cause circuits upstream from the mapping location to degrade or otherwise change differently depending on whether or not data signals are coupled through the circuits. These upstream circuits include circuitry in the input path between the externally-accessible terminal and the memory array itself. Therefore, circuits connected to the data terminals to which data signals are applied during burn-in behave differently than the circuits connected to the remaining data terminals after burn-in is completed. In particular, circuits connected to the data terminals not receiving data signals may experience increased duty cycle degradation after burn-in relative to the circuits connected to the data terminals receiving burn-in test signals.

Memory devices often rely on a data strobe signal to accurately latch data into the device. For proper operation, the data strobe signal is timed relative to the incoming data signals such that the device latches the data at the appropriate time. Duty cycle degradation can cause the data to arrive out of synch with the data strobe signal. In one experiment, it was found that remaining inputs, not cycled during the burn-in process, experienced 50 ps greater drift than the inputs cycled during burn-in. This 50 ps drift may be negligible in some applications, but as memory devices are operated at higher speeds with tighter specifications, the discrepancy becomes significant. There is therefore a need for a technique to reduce unequal degradation of memory devices resulting from burn-in testing.

One or more embodiments of the present invention reduce uneven degradation during burn-in by providing a toggling signal to be applied at the remaining input paths to a memory array which do not receive burn-in test signals. Rather than being held in a fixed state during the burn-in process, components along the remaining input paths are toggled as well. Consequently, they degrade at a more similar rate to their counterpart inputs that did receive burn-in test signals. While methods, systems and devices according to embodiments of the present invention may be used for improved burn-in testing, embodiments of the present invention may also be used for other types of compression testing.

Figure 1:
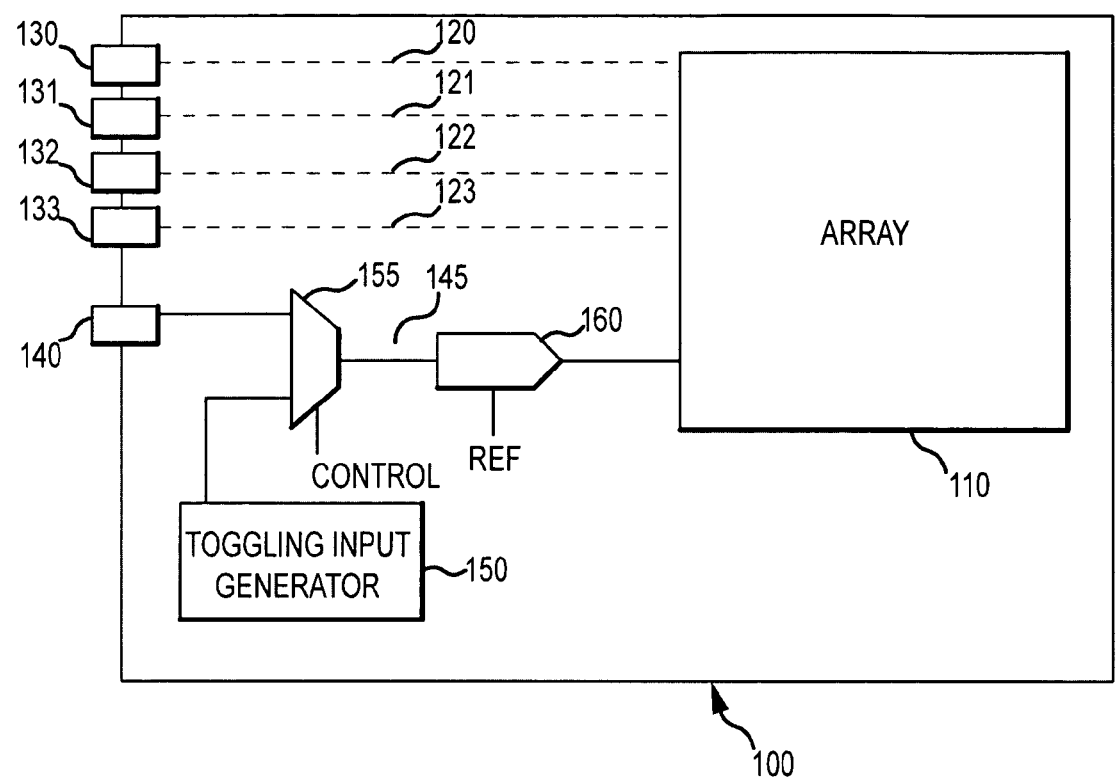
FIG. 1 depicts a configuration of a device according to an embodiment of the present invention.

FIG. 1 depicts a device 100 according to an embodiment of the present invention. The device 100 is suitable for use in a system that reduces unequal effects of burn-in between used and unused input paths. The device 100 in FIG. 1 contains an array of memory cells 110. The memory cells can be any type of memory cells and may be arranged in any manner. Embodiments of the present invention may also be used with electronic or electromechanical components other than memory devices. The device 100 includes four input paths 120-123 that are utilized during the burn-in process. The input paths 120-123 connect externally-accessible terminal 130-133 to the array of memory cells 110. Although not depicted in FIG. 1, a variety of components may be included along the input paths 120-123 including buffers, sequencers, decoders and the like that couple signals applied to externally-accessible terminals 130-133 to the array 110. During the burn-in process, test signals will be applied to externally-accessible terminals (e.g., pins) 130-133 and coupled to the array 110 through the input paths 120-123. Other remaining external input pins and input paths will not receive test signals, including externally-accessible terminal 140 in FIG. 1. Although four externally-accessible terminals and input paths receiving test signals are shown in FIG. 1 it is to be understood that any number of input paths may be used to receive test signals in embodiments of the present invention. The number of input paths will generally be determined by the requirements of the array of memory cells 110 or other active portion of the device being tested and the requirements of the compression testing.

The remaining externally-accessible terminal 140 is coupled to the array 110 through the remaining input path 145. Although only one remaining input pin and remaining input path are depicted in FIG. 1, any number of remaining input pins and paths may be used in embodiments of the present invention, as generally required by the array 110 or other component being accessed in the device 100 and the compression testing scheme. The remaining externally-accessible terminal 140 is not used by the burn-in testing system, and will not receive test signals during the burn-in process. The externally-accessible terminal 140 is decoupled from the array 110 during burn-in testing such that the remaining input path 145 is divided into two disconnected portions—one coupled from the remaining terminal 140, and a second portion coupled to the array 110. During compression testing, signals sent through one or more of the input paths 120-123 may be mapped onto the second portion of the input path 145 such that they reach the memory cells in the array 110. However, signals sent through the first portion of the input path 145 including the multiplexer 155 and the input buffer 160 are not coupled to the array 110 during testing. In prior systems, this first portion of the input path 145 would be held in one state, usually a high voltage state, during burn-in testing, causing unequal degradation between the first portion of the input path 145 and input paths 120-123. In the device 100, however, a toggling signal generator 150 is provided. The toggling signal generator 150 creates a toggled signal to apply to the otherwise unused portion of the remaining input path 145. Switching circuitry is provided in the device to couple the toggling input signal to one or more remaining input paths during burn-in operation. Although the signals from the toggling input generator 150 are not applied to the array, the remaining input path will also toggle during the burn-in process, and unequal degradation is avoided or reduced. In the embodiment of FIG. 1, the toggling input generator 150 couples the toggling signal to an input of multiplexer 155. The multiplexer 155 couples either the toggling input signal or the signal at externally-accessible terminal 140 to the input buffer 160, depending on the control signal applied to the multiplexer 155. When the control signal indicates the test mode (e.g., burn-in operation) the multiplexer will couple the toggling input signal to the input buffer 160. The input buffer 160 further receives a reference voltage and, during normal operation, couples the input path 145 to the array 110. The toggling signal generated by the toggling input generator 150 may generally be any varying, preferably periodic signal and a clock or other available signal from within the device 100 may be used, or a separate signal generator provided. In some embodiments, the toggling signal approximates the signals utilized during burn-in in voltage and/or current level.

Figure 2:
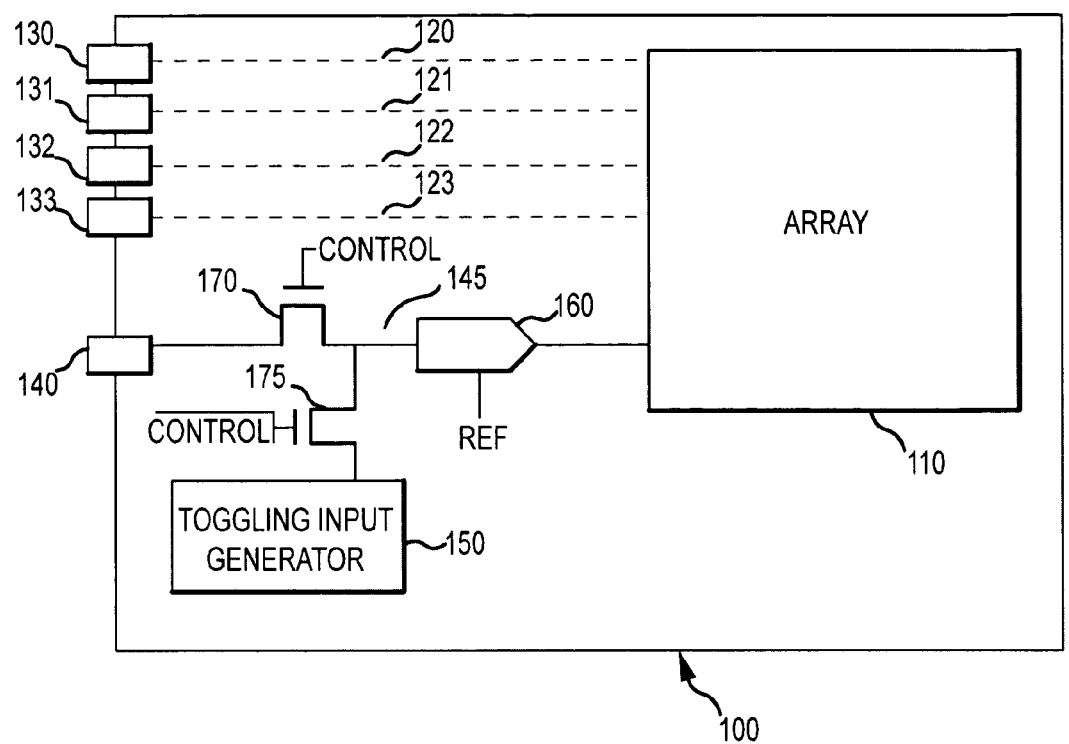
FIG. 2 depicts another configuration of a device according to an embodiment of the present invention.

FIG. 2 depicts another implementation of an embodiment of the present invention. The device 100, configured as in FIG. 1 with like components given like reference numbers, is shown having four input paths 120-123 receiving test signals and one remaining input path 145 including the input buffer 160. Transistor 170 and transistor 175 couple the input buffer to the remaining externally-accessible terminal 140 and the toggling input signal generator 150, respectively. The gate of transistor 170 is coupled to a control signal such that the transistor is turned off during burn-in, and decoupled from the input pin 140. The gate of transistor 175 is coupled to the inverse of the control signal, such that the transistor is turned on during the burn-in process, coupling the input buffer 160 to the toggling input signal generator 150. The configuration depicted in FIG. 2 may be advantageous for ease of implementation in some devices where transistor 170 is already present to provide other functionality in the device, such as overshoot or electrostatic discharge protection.

Figure 3:
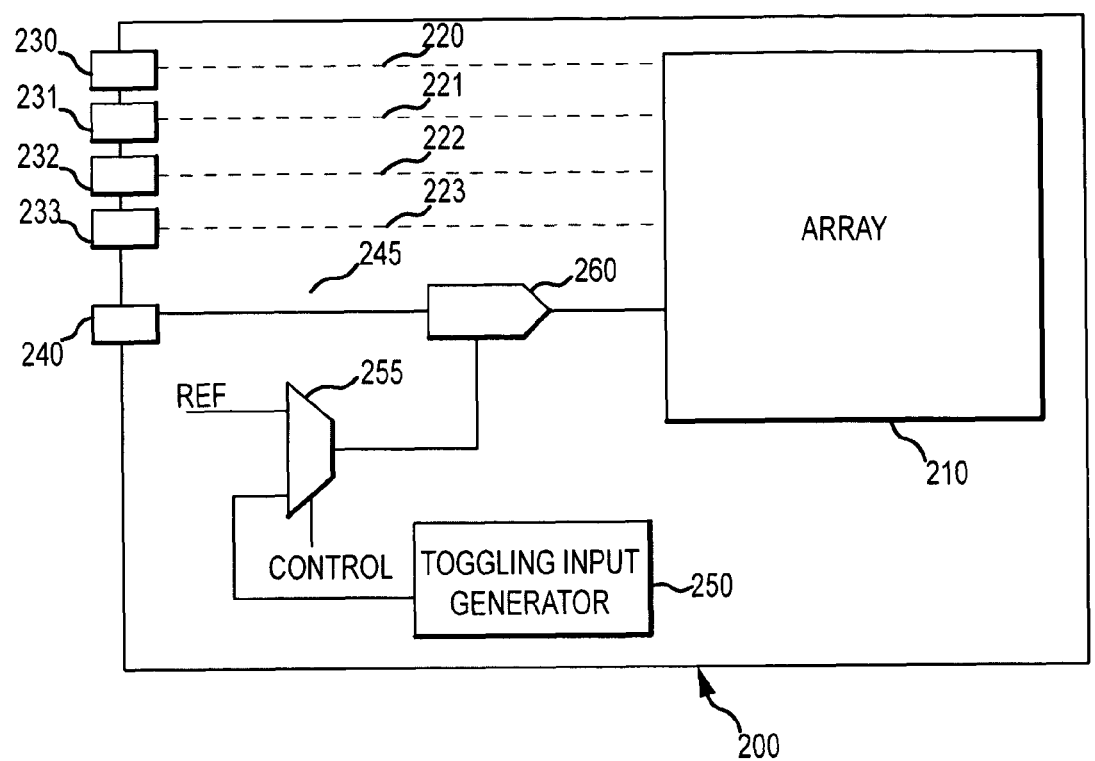
FIG. 3 depicts another configuration of a device according to an embodiment of the present invention.

FIG. 3 depicts another device 200 capable of reducing unequal burn-in degradation, in accordance with an embodiment of the present invention. The device 200 includes an array of memory cells 210. As described above, any memory device may be included in the array 210 in any configuration. In other embodiments of the invention, other electronic components may be used instead of or in addition to memory cells. Input paths 220-223 connect the array 210 to the externally-accessible terminals 230-233, respectively. Input paths 220-223 will receive testing signals during burn-in testing through the terminals 230-233. As described above, any number of input paths may be provided to receive testing signals. Additionally, a variety of other components may be provided along input paths 220-223 including buffers, decoders, sequencers and the like to couple signals to the array 210. Remaining externally-accessible input terminal 240 accesses remaining input path 245 to the array 210. The remaining terminal 240 is decoupled from the array 210 during testing operation such that a first portion of the input path 245 is coupled to the remaining terminal 240, but a second portion coupled to the array 210 is decoupled from the first portion and receives test signals mapped from one or more of the input paths 220-223 to provide test signals to the array 210. The first portion of the remaining input path 245 does not receive testing signals during the burn-in process and is instead decoupled from the array 210. An input buffer 260 couples the array to the remaining externally-accessible terminal 240 during normal operation, but is part of the first portion of the input path 245 that is decoupled from the array during testing. Although not shown, other components may also be included along the remaining input path 245. A toggling signal generator 250 generates a toggling, preferably periodic, signal and couples the toggling signal to a multiplexer 255. The multiplexer 255 receives a control signal at a control terminal, and couples either a normal operating reference voltage or the toggling signal to the reference terminal of the input buffer 260. The output of the buffer 260 corresponds to the difference between the voltage applied to the pin 240 and the voltage of the toggling signal generated by the toggling input generator 250. In this manner, during burn in testing, the input buffer 260 receives a toggling signal during testing and avoids unequal degradation to corresponding components in the input paths 220-223.

Figure 4:
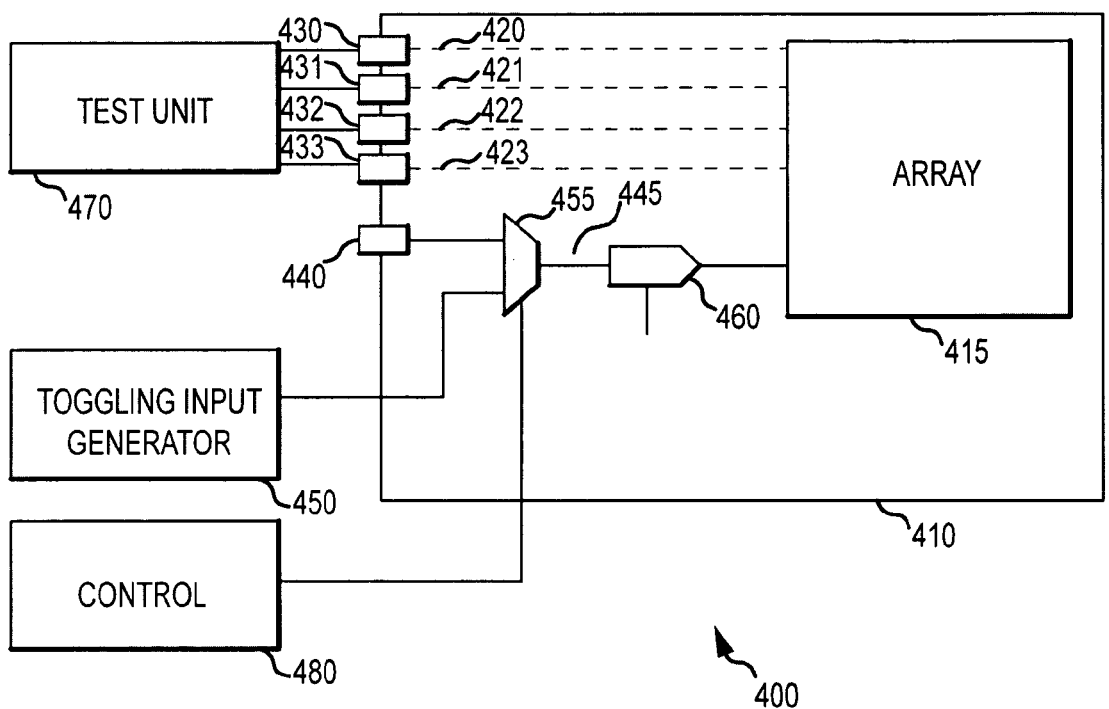
FIG. 4 depicts a system according to an embodiment of the present invention.

FIG. 4 depicts a system according to an embodiment of the invention for reducing unequal testing degradation in a device. The system 400 includes a device 410. The device 410 may include an array of memory cells 415, or other components as described above. The device 410 includes a plurality of input paths receiving testing signals from externally-accessible terminals 430-433 during a testing process, such as burn-in testing, including input paths 420-423. As described above, the input paths receiving testing signals may contain a variety of components coupling the array 415 to the externally-accessible terminals 430-433. The device 410 further includes a remaining externally-accessible terminal 440 coupling a remaining input path 445 to the array 415 during normal operation. During testing, however, the terminal 440 is decoupled from the array 415 by splitting the remaining input path 445 into two portions—one coupled to the terminal, and one to the array. The portion coupled to the array receives testing signals mapped from one of the input paths 420-423 receiving testing signals. Any of the devices shown in FIGS. 1-3 or another device according to an embodiment of the present invention may be used as the device 410. As depicted and described in FIG. 1, a multiplexer 455 and input buffer 460 couple the externally-accessible terminal 440 to the array 415. A test unit 470 generates the burn-in signals and couples the burn-in signals to the input terminals 430-433. The test unit 470 utilizes only a portion of the available externally-accessible terminals (the burn-in input pins) and does not apply signals to the remaining externally-accessible terminals, such as remaining terminal 440. Remaining input path 445 is decoupled from the array 415 by internal test mode circuitry during burn-in testing, the input path 445 is split, as described above into two portions. A toggling input signal generator 450 generates a toggling signal, and couples the toggling signal to the first portion of the remaining input path 445 containing the input buffer 260. The toggling input signal generator 450 is shown in FIG. 4 as external to the device 410 in accordance with an embodiment of the invention. As shown in FIGS. 1-3, however, the toggling input signal generator 450 may be an integral part of the device being tested. The toggling input signal generator 450 generates a toggling, preferably periodic signal, that causes the remaining input paths to have similar degradation after burn-in to the burn-in input paths. In some embodiments, a clock signal is used as the toggling input signal. A control unit 480 develops a test mode control signal indicative of testing operation, such as burn-in testing, and applies the control signal to the burn-in input path 145. In the embodiment shown in FIG. 4, the control signal is coupled to the multiplexer 455. The multiplexer 455, responsive to the control signal indicating burn-in testing, couples the toggling input signal to the input buffer 460. During normal operation, the multiplexer couples the input buffer 460 to the externally-accessible terminal 440. The control unit 480 is external to the device 410 in the embodiment shown in FIG. 4, however in other embodiments, the control unit 480 may be located within the device 410 or the test unit 470. Further, although only one device 410 is shown in FIG. 4, the test unit 470 is coupleable to a plurality of devices in accordance with embodiments of the invention. Each of the plurality of devices may have their own toggling input signal generator, or may receive a toggling input signal from the generator 450.

From the foregoing it will be appreciated that, although specific embodiments of the invention have been described herein for purposes of illustration, various modifications may be made without deviating from the spirit and scope of the invention.

What is claimed is:

1. A method for reducing unequal degradation during testing of a device having a first set of externally-accessible terminals coupled to an array of memory cells through respective first input paths and a second externally-accessible terminal, in addition to the first set of externally-accessible terminals, which is coupleable to the array through a second input path, different from the respective first input paths, the method comprising:

applying a test signal to each of the first set of externally accessible input terminals;

wherein the test signal is transmitted from each of the externally-accessible terminals in the first set to the array through the respective first input paths corresponding to the first set of externally accessible terminals;

decoupling the second externally-accessible terminal from the array; and applying a toggling signal to the second input path corresponding to the second externally-accessible terminal during the testing.

2. The method of claim 1 wherein the act of decoupling includes decoupling such that a first portion the second input path is connected to the second externally-accessible terminal and a second portion of the second input path is connected to the array, but the first and second portions of the second input path are not coupled together; and wherein the act of applying the toggling input signal to the second input path comprises applying the toggling input signal to the first portion of the remaining input path.

3. The method of claim 1 wherein the act of applying the test signal is performed such that the second input path corresponding to the second externally-accessible terminal does not receive the test signal.

4. The method of claim 1 wherein the test signal is generated by an external test unit that does not generate the toggling signal.

5. The method of claim 1 further comprising selecting the toggling signal such that duty cycle degradation of the second input path after testing is similar to degradation of the respective first input paths.

6. The method of claim 1 wherein the act of applying the toggling signal comprises coupling the toggling input to an input buffer in the second input path.

7. The method of claim 6 wherein the act of applying the toggling signal to the input buffer comprises applying the toggling input to an input terminal of the input buffer.

8. The method of claim 6 wherein the act of applying the toggling signal to the input buffer comprises applying the toggling input to a reference terminal of the input buffer.

9. The method of claim 1 further comprises generating the toggling signal within the device.

10. A device configured for experiencing reduced unequal testing degradation, the device comprising:

an array of memory cells;

a first externally-accessible terminal receiving a test signal;

a first input path coupling the test signal to the array of memory cells;

a second externally-accessible terminal;

a second input path coupling the second externally accessible terminal to the array of memory cells during normal operation and decoupled from the array of memory cells during testing; and switching circuitry coupling a toggling signal to the second input path during the testing.

11. The device according to claim 10 wherein the second input path does not receive test signals.

12. The device according to claim 10 wherein the second input path includes an input buffer.

13. The device according to claim 12 wherein the switching circuitry comprises a multiplexer coupled between the input buffer and a toggling signal generator.

14. The device according to claim 13 wherein the input buffer includes a reference terminal, and the multiplexer is coupled between the reference terminal of the input buffer and the toggling signal generator.

15. The device according to claim 13 further comprising the toggling signal generator creating the toggling signal.

16. The device according to claim 10 wherein the second input path includes an input buffer and the switching circuitry comprises at least a first switch coupled between the second externally-accessible terminal and the input buffer and a second switch coupled between the input buffer and a toggling signal generator.

17. The device according to claim 16 wherein the switches comprise transistors.

18. The device according to claim 16 wherein the first switch is closed during the normal operation and open during the testing and the second switch is open during the normal operation and closed during the testing.

19. The device according to claim 17 wherein the first switch is utilized during the normal operation as an overshoot protection device.

20. A system for improved testing of a device, the system comprising:
   a test unit generating burn-in test signals;
   a toggling signal generator creating a toggling signal; and
   the device comprising:
      an array of memory cells;
      a first externally-accessible terminal receiving the burn-in test signals;
      a first input path coupling the burn-in test signals to the array of memory cells;
      a second externally-accessible terminal;
      a second input path coupling the second externally accessible terminal to the array of memory cells during normal operation and decoupled from the array of memory cells during the burn-in testing; and
      switching circuitry coupling the toggling input signal to the second input path during the burn-in testing.

21. The system according to claim 20 wherein the test unit is coupled to the first externally-accessible terminal during the burn-in testing.

22. The system according to claim 20 wherein the second input path does not receive the burn-in test signals.

23. The system according to claim 20 wherein the toggling signal comprises a clock signal.

24. The system according to claim 20 wherein the switching circuitry comprises a multiplexer coupling the toggling signal to the second input path responsive to the test mode signal.

25. The system according to claim 20 further comprising a plurality of devices, each comprising:
   a respective array of memory cells;
   a first respective externally-accessible terminal receiving the burn-in test signals from the test unit;
   a first respective input path coupling the burn-in test signals to the respective array of memory cells;
   a second respective externally-accessible terminal;
   a second respective input path coupling the second respective externally accessible terminal to the respective array of memory cells during normal operation and decoupled from the array of memory cells during burn-in testing; and
   respective switching circuitry coupling the toggling signal to the second respective input path during the burn-in testing.

* * * * *

UNITED STATES PATENT AND TRADEMARK OFFICE
CERTIFICATE OF CORRECTION

| | |
|---|---|
| PATENT NO. | : 7,966,530 B2 |
| APPLICATION NO. | : 12/002830 |
| DATED | : June 21, 2011 |
| INVENTOR(S) | : Bryce Cook et al. |

It is certified that error appears in the above-identified patent and that said Letters Patent is hereby corrected as shown below:

In column 6, line 5, in Claim 2, delete "portion the" and insert -- portion of the --, therefor.

Signed and Sealed this
Ninth Day of August, 2011

David J. Kappos
*Director of the United States Patent and Trademark Office*